United States Patent
Stilianos et al.

(10) Patent No.: US 6,459,042 B1
(45) Date of Patent: Oct. 1, 2002

(54) ELECTRICAL CONNECTOR WITH AN ELECTRICAL COMPONENT HOLDER

(75) Inventors: Demetri Stilianos, Howell; Michael John Luettgen, Bloomfield, both of MI (US)

(73) Assignee: Autoliv ASP, Inc., Ogden, UT (US)

( * ) Notice: Subject to any disclaimer, the term of this patent is extended or adjusted under 35 U.S.C. 154(b) by 0 days.

(21) Appl. No.: 09/466,857

(22) Filed: Dec. 17, 1999

(51) Int. Cl.[7] .............................................. H01B 17/00
(52) U.S. Cl. ................................................. 174/138 G
(58) Field of Search ............................ 439/620, 79, 80; 361/760, 763, 767, 770, 807–810; 174/138 G

(56) References Cited

U.S. PATENT DOCUMENTS

| | | | |
|---|---|---|---|
| 3,525,972 A | * | 8/1970 | Asick et al. |
| 3,881,961 A | * | 5/1975 | Nation ....................... 136/173 |
| 4,171,862 A | * | 10/1979 | Krasser |
| 4,386,819 A | | 6/1983 | Asick et al. |
| 4,401,355 A | | 8/1983 | Young |
| 4,428,633 A | | 1/1984 | Lundergan et al. |
| 4,469,393 A | * | 9/1984 | Chewning, Jr. et al. |
| 4,602,122 A | * | 7/1986 | Lint ....................... 174/138 G |
| 4,690,479 A | | 9/1987 | Hollyday et al. |
| 4,726,776 A | | 2/1988 | Billman et al. |
| 4,779,164 A | * | 10/1988 | Menzies, Jr. |
| 5,000,694 A | * | 3/1991 | Komatsu |
| 5,247,250 A | * | 9/1993 | Rios ............................. 439/70 |
| 5,360,353 A | | 11/1994 | Kinoshita |
| 5,403,195 A | | 4/1995 | Thrush et al. |
| 5,443,404 A | * | 8/1995 | Matsuoke .................... 439/717 |
| 5,605,477 A | | 2/1997 | Wu et al. |
| 5,707,249 A | * | 1/1998 | Byrd ........................... 439/500 |
| 6,045,397 A | * | 4/2000 | Iwamura et al. ............. 439/493 |
| 6,231,370 B1 | * | 5/2001 | Morin ......................... 439/366 |

FOREIGN PATENT DOCUMENTS

| | | |
|---|---|---|
| EP | 0 114 244 | 11/1983 |
| EP | 0 129 294 | 6/1984 |
| GB | 2 239 739 A | 11/1989 |
| GB | 2 345 816 A | 1/1999 |

OTHER PUBLICATIONS

IBM Technical Disclosure, Garcia vol. 14, No. 2, p. 573, Jul. 1971.*

* cited by examiner

Primary Examiner—Neil Abrams
(74) Attorney, Agent, or Firm—Sally J. Brown

(57) ABSTRACT

A circuit assembly 10 for holding an electronic component 26 relative to a circuit board 16 comprises a housing 12 coupled to the circuit board 16. A separable cradle 24 is coupled to the housing 12 and is sized to receive the electronic component 26. The cradle 24 has a support post 28 for spacing the cradle 25 a predetermined distance from the circuit board 16. In a further aspect of the invention, the housing 12 may be a module housing or a connector 14. The cradle 24 may be separable from the housing, Leads (26) pas through the cradle holes 46 and housing holes 44 to be soldered to the circuit board.

21 Claims, 3 Drawing Sheets

ELECTRICAL CONNECTOR WITH AN ELECTRICAL COMPONENT HOLDER

TECHNICAL FIELD

The present invention relates generally to electrical connectors, and more specifically to electrical connectors that are used to carry electrical components.

BACKGROUND

Electronic circuit designers usually face a shortage of circuit board space. Many electrical circuits have a connector housing that connects the circuit board to other electrical components located off the circuit board. Also, many circuit boards are contained in a circuit board housing that is used to protect the circuit board therein.

Oftentimes large components are used as part of the circuitry. For example, electrolytic capacitors are often incorporated for noise reduction. The electrolytic capacitors are relatively large and therefore occupy a considerable amount of circuit board area. In many applications such as in automotive vehicles, reducing the size of modules containing circuit boards is particularly important. This is due to the ever increasing content and package space reduction.

It would therefore be desirable to provide an assembly that prevents large size components from taking a substantial amount of board space.

SUMMARY OF THE INVENTION

It is therefore one object of the invention to provide a connector or module housing that incorporates a means for holding an electronic component so that overall circuit board size may be reduced.

In one aspect of the invention, a circuit assembly for holding an electronic component relative to a circuit board comprises a housing coupled to the circuit board. A separable cradle is coupled to the housing and is sized to receive the electronic component. The cradle may have a support post for spacing the cradle a predetermined distance from the circuit board and to prevent a large component from vibrating. In a further aspect of the invention, the housing may be a module housing or a connector. The cradle may be separable from the housing.

One advantage of the invention is that if the cradle is made to be separable, a common connector may be formed for those applications requiring the positioning of a component above a circuit board and those not. Thus, due to economies of scale, the connector portion will be less expensive to produce than if two connectors, one distinct connector with a cradle and one distinct connector without, are produced. Further, the cradle may be designed with locking features so that the electrical component supported by the cradle is securely positioned to provide a robust assembly.

Other objects and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
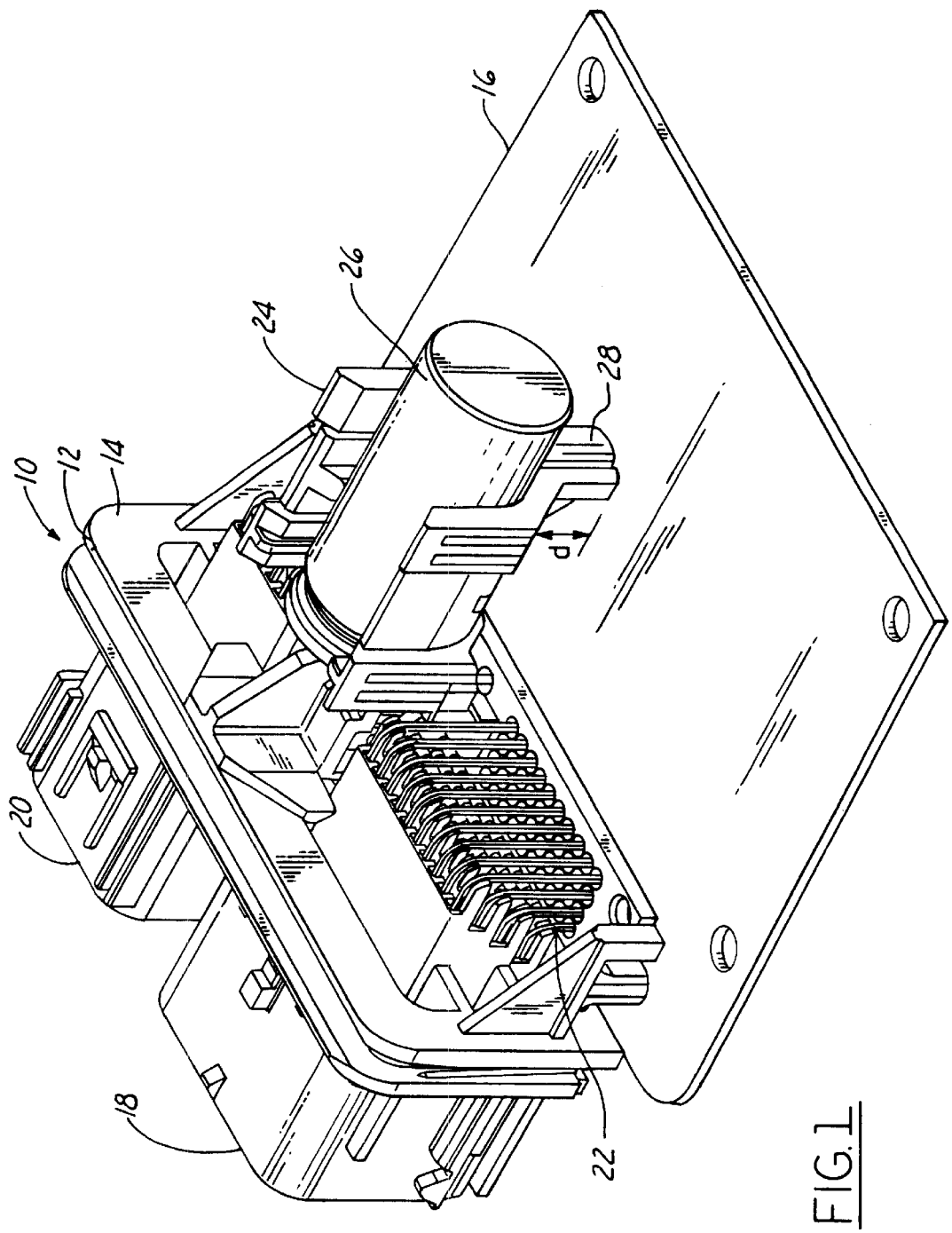
FIG. 1 is a perspective view of a connector having an electronic component coupled thereto through a cradle in accordance with the present invention.

In the following figures, the same reference numerals are used to identify identical components in the various views. The present invention is illustrated with respect to a connector housing. However, the present invention may be applied to other housings such as a module housing or other support structure. Also, a support post is incorporated into the cradle. Support post may not be present in all embodiments.

Referring now to FIG. 1, a circuit assembly 10 is illustrated having a housing 12 such as a connector housing or simply connector 14 that is coupled to a circuit board 16. Connector 14 may be heat staked or mechanically coupled to circuit board 16. The present invention is also applicable to a module housing instead of a connector 14. A module housing, for example, may surround and protect circuit board 16.

Connector 14 may include various structures for connecting to other circuits including the shape, keys and various mechanical locks as would be evident to those skilled in the art. As illustrated, a first connection portion 18 and a second connector portion 20 are used for coupling to mating connectors having a particular shape. Electrical conductors 22 extend between a respective first connector portion 18 and circuit board 16 and second connector portion 20 and circuit board 16. Those skilled in the art would recognize that various configurations of connectors, the number of terminals and the configuration of the terminals such as whether they are sockets or pins would be evident to those skilled in the art.

A cradle 24 is coupled to housing 12 and is used to support an electrical component 26. Although cradle 24 may be integrally formed with housing 12, cradle 24 is preferably separable as will be further described below. Cradle 24 positions electrical component 26 a predetermined distance "d" above circuit board 16. The distance "d" is preferably greater than the size of the components in the circuit board so that they may be positioned thereunder. Also, cradle 24 may be used to securely fasten the electrical component 26 in a position to prevent damage to the electrical component from vibrations or other movement.

A support post 28 that is preferably integrally formed with cradle 24 may be used to secure cradle 24 to circuit board 16. Support post 28 is particularly suitable for large components particularly to prevent them from vibrating. Small components may not require a support post. Support post 28 has a securing end 25 that preferably extends through circuit board 16. The length of support post 28 corresponds to distance "d" plus securing end.

Figure 2:
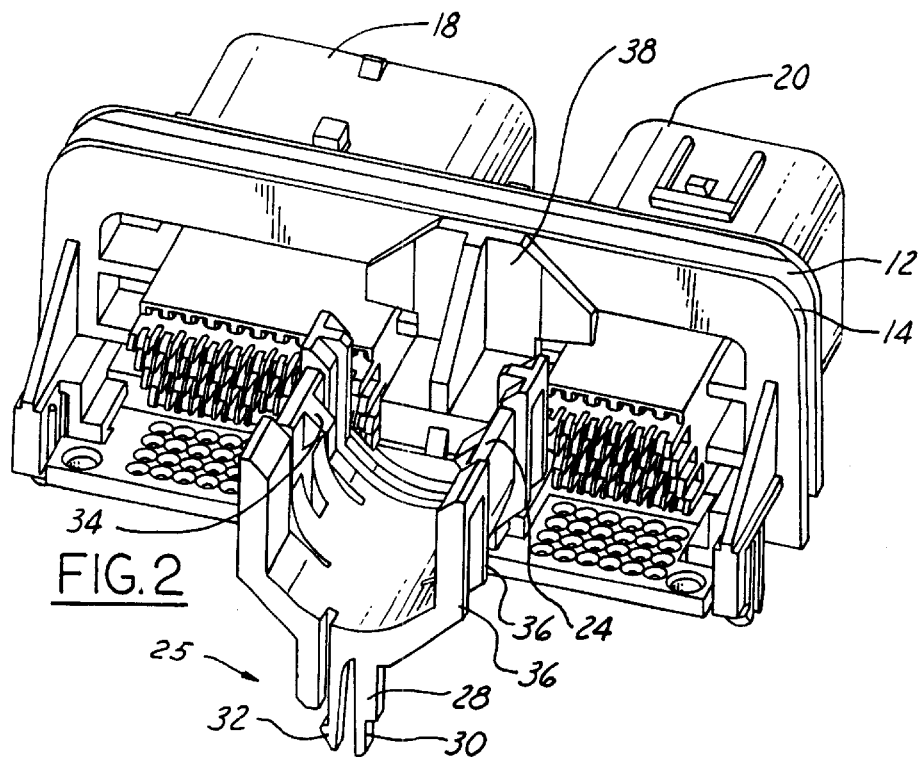
FIG. 2 is a perspective view of a connector having a cradle according to the present invention.

Referring now to FIG. 2, cradle 24 is illustrated without an electrical component and connector 14 is illustrated without conductors 22. As can be seen, securing end 25 of support post 28 has a first leg 30 and a second leg 32 that extend through circuit board 16. A snap tang or pair of tangs 34 is incorporated into cradle 24 to snap fit around electrical component 26.

Structural ribs 36 formed in cradle 24 provide structural rigidity. Structural ribs 36 prevent cradle 24 from flexing during vibration or mechanical shock. Structural ribs 36 reduce the fatigue and potential breakage of cradle 24 and the electrical component 26.

Cradle 24 has an end portion 38 that is used to slidably connect with housing 12. End portion 38 is preferably integral with cradle 24.

Figure 3:
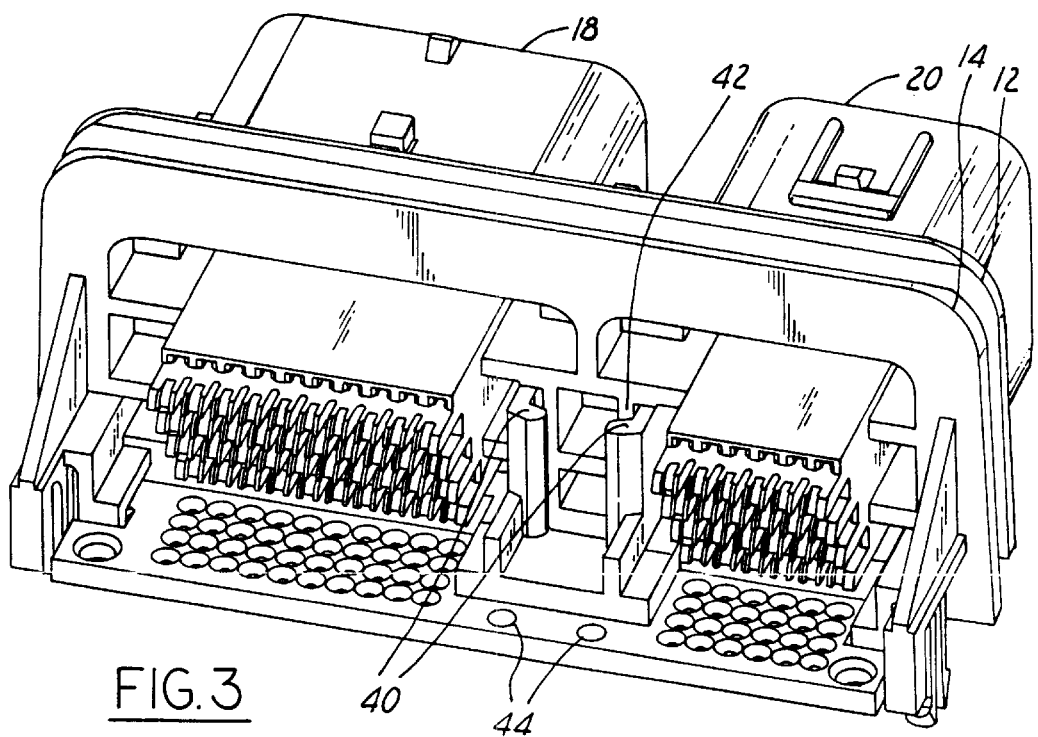
FIG. 3 is a perspective view of a connector with the cradle removed.

Referring now to FIG. 3, a pair of guides 40 are integrally formed in housing 12. Guides 40 define a guide channel 42 therebetween for slidably receiving end portion 38 of cradle 24. As illustrated, end portion 38 is received from the top and slid down into guide channel 42.

Interconnect holes 44 are positioned in a predetermined location on housing 44 for receiving terminal leads of electrical component 26. The number of interconnect holes 44 corresponds to the number of leads on the component.

Figure 4:
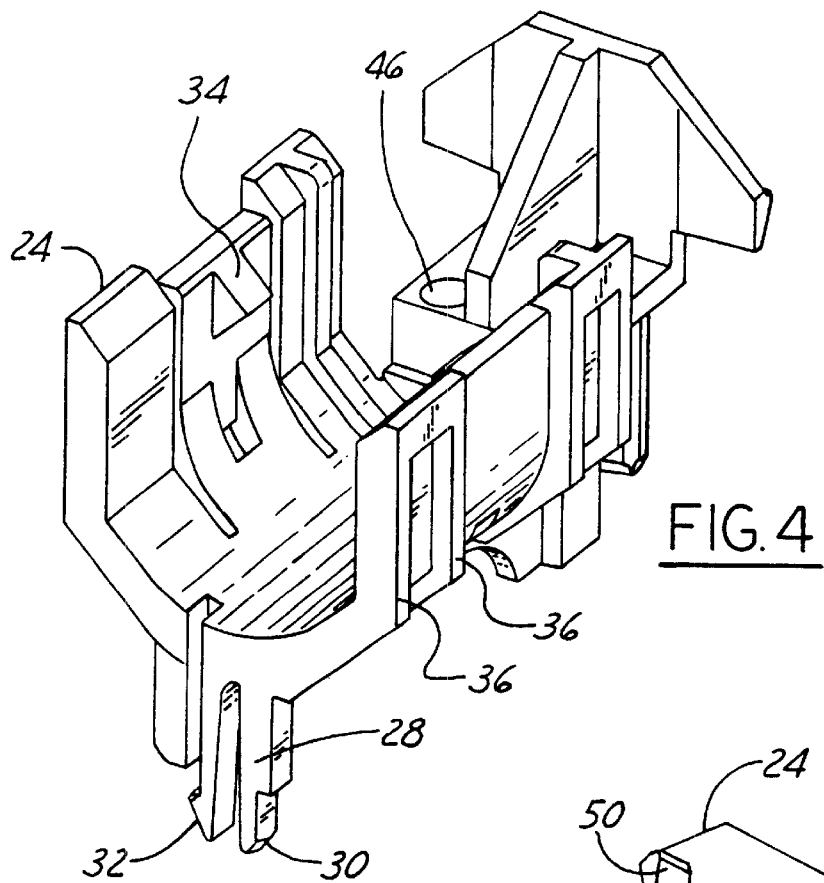
FIG. 4 is a perspective view looking at the top and side of the cradle.
Figure 5:
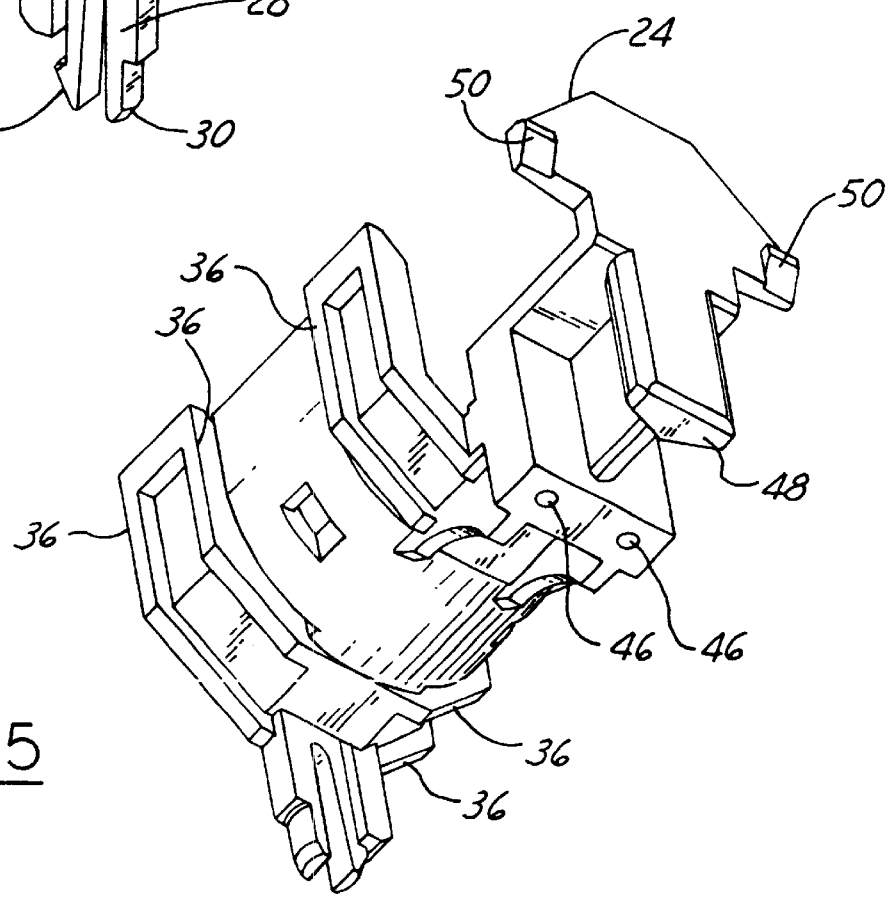
FIG. 5 is a perspective view of the cradle of FIG. 4 from the bottom and side view.

Referring now to FIGS. 4 and 5, structural ribs 36 are illustrated extending partially around cradle 26.

A pair of lead holes 46 extend through end portion 38. Lead holes 46 are sized to receive the leads from the electrical component 26. As illustrated two lead holes 46 are shown. However, three or more holes may also be used depending on the particular component.

Lead holes 46 are preferably tapered in shape. As shown best in 46, the diameter of the lead holes 46 is greater at the top of the lead hole away from the circuit board whereas, at the bottom of the end portion 38, lead holes 46 have a smaller diameter. The diameter at the bottom portion is preferably sized to provide an interference fit with the leads of the electrical component that extend therethrough.

End portion 38 has an attachment member 48 extending therefrom. Attachment member 48 is preferably integrally formed with an end portion 38 and cradle 24. Attachment member 48 is sized to be received within the guide channel 42 of housing 12. Attachment member 48 is preferably sized to conform to guide channel 42 in a snug fashion to prevent movement of attachment member 48 within guide channel 42. As illustrated, attachment member 48 is dovetail in shape to provide a secure fit Of course, other shapes would be evident to those skilled in the art. End portion 38 has locking tabs 50 that extend therefrom. Locking tabs 50 extend in a direction toward housing 12. As the attachment member 48 is positioned within the guide channel 42, locking tabs 50 engage housing 12 to prevent attachment member 48 and thus cradle 24 from moving with respect to housing 12.

In operation, if the circuit assembly 10 requires a large component, a cradle 24 may be used with housing 12. Cradle 24 and housing 12 may be assembled prior to assembly onto circuit board 16 or after. Electrical component 26 is placed within cradle 24 and is retained therein in place by tangs 34. As the electrical component is placed within cradle 24, the leads of the component are positioned to extend through lead holes 46. Thereafter, the leads are soldered in place with the circuit board 16. The leads of the electrical component 26 may be simultaneously soldered, for example, by wave soldering or selective soldering with the other components of circuit board 16.

Because cradle 24 is spaced apart a distance from circuit board 16, the only area required for the electrical component 26 is for support posts 28. Thus, further electrical components and circuit traces may be positioned under cradle. Thus, a circuit formed according to the present invention takes less board space than prior known circuit configurations.

While particular embodiments of the invention have been shown and described, numerous variations and alternate embodiments will occur to those skilled in the art. Accordingly, it is intended that the invention be limited only in terms of the appended claims.

What is claimed is:

1. A circuit assembly holding an electronic component having leads and a circuit board comprising:
   a housing coupled to the circuit board, said housing having interconnect holes therethrough: and
   a cradle having a first end portion coupled to the housing, said cradle sized to receive the electronic component, said cradle having a second end portion extending outward from said housing and positioned a predetermined distance above the circuit board, said cradle comprising a pair of lead holes extending therethrough, said lead holes aligned with interconnect holes through said housing, said interconnect holes and said lead holes receiving leads from the electronic component.

2. A circuit assembly as recited in claim 1 wherein said first end portion having an attachment member extending therefrom, and wherein said housing comprises a guide channel sized to receive said attachment member.

3. A circuit assembly as recited in claim 2 further comprising tangs extending from said cradle, said tangs engaging said electronic component when said electronic component is positioned within said cradle.

4. A circuit assembly as recited in claim 1 wherein said cradle is separable from the housing.

5. A circuit assembly as recited in claim 1 wherein said cradle comprising structural ribs extending at least partially therearound.

6. A circuit assembly as recited in claim 1 wherein said cradle comprising a pair of lead holes extending therethrough.

7. A circuit assembly as recited in claim 6 wherein said lead holes comprise tapered holes.

8. A circuit assembly as recited in claim 7 wherein said tapered holes align with interconnect holes through said housing.

9. A circuit assembly as recited in claim 1 wherein said housing comprises a component housing.

10. A circuit assembly as recited in claim 1 wherein said housing comprises a connector housing.

11. A circuit assembly as recited in claim 1 further comprising a support post for spacing said cradle said predetermined distance from said circuit board.

12. A circuit assembly as recited in claim 1 wherein said cradle is removable from the housing.

13. A circuit assembly holding an electronic component having leads and a circuit board comprising:
   a housing coupled to the circuit board, said housing comprising guides forming a guide channel, said housing having interconnect holes therethrough; and
   a separable cradle having a first end portion coupled to the housing sized to receive the electronic component, said cradle having a second end portion extending outward from said housing, said cradle comprising a support post adjacent to said second end portion for spacing said cradle a predetermined distance from the circuit board, said cradle having an attachment member sized to be slidably received within said guide channel, said cradle comprising a pair of lead holes extending therethrough, said lead holes aligned with interconnect holes through said housing, said interconnect holes and said lead holes receiving leads from the electronic component.

14. A circuit assembly as recited in claim 13 further comprising tangs extending from said cradle, said tangs engaging said electronic component when said electronic component is positioned within said cradle.

15. A circuit assembly as recited in claim 13 wherein said lead holes comprise tapered holes.

16. A circuit assembly as recited in claim 13 wherein said housing comprises a component housing.

17. A circuit assembly as recited in claim 13 wherein said housing comprises a connector housing.

18. A circuit assembly as recited in claim 13 further comprising a support post for spacing said cradle said predetermined distance from said circuit board.

19. A connector assembly comprising:
   a connector housing, said housing having interconnect holes therethrough; and
   a separable cradle having a first end portion slidably coupled to the connector housing, said cradle sized to receive an electronic component having leads, said cradle having a second end portion extending outward from said housing, said cradle comprising a support post for Spacing said cradle a predetermined distance above the circuit board, said cradle comprising a pair of lead holes extending therethrough, said lead holes aligned with said interconnect holes through said housing, said interconnect holes and said lead holes receiving leads from the electronic component.

20. A connector assembly as recited in claim 19 wherein said first end portion having an attachment member extending therefrom, and wherein said connector housing comprises a guide channel sized to receive said attachment member.

21. A circuit assembly as recited in claim 19 further comprising tangs extending from said cradle, said tangs engaging said electronic component when said electronic component,is positioned within said cradle.

* * * * *